(12) United States Patent
Ko et al.

(10) Patent No.: US 6,638,841 B2
(45) Date of Patent: Oct. 28, 2003

(54) METHOD FOR REDUCING GATE LENGTH BIAS

(75) Inventors: Kai-Jen Ko, Hsin-Chu (TW); Yuan-Li Tsai, Taipei (TW); Ming-Hui Wu, Taipei (TW); Steven Huang, Hsin-Chu (TW); Ching-Chun Hwang, Taichung (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 10/117,042

(22) Filed: Apr. 8, 2002

(65) Prior Publication Data

US 2003/0082895 A1 May 1, 2003

Related U.S. Application Data

(60) Provisional application No. 60/336,385, filed on Oct. 31, 2001.

(51) Int. Cl.⁷ ............... H01L 21/8238; H01L 21/8236; H01L 21/3205; H01L 21/4763
(52) U.S. Cl. ............... 438/585; 438/232; 438/275
(58) Field of Search ............... 438/585, 232, 438/275, 294, 373, 305, 306, 231, 549

(56) References Cited

U.S. PATENT DOCUMENTS

| 5,744,845 | A | * | 4/1998 | Sayama et al. | 257/371 |
|---|---|---|---|---|---|
| 6,043,544 | A | * | 3/2000 | Michael et al. | 257/407 |
| 6,136,656 | A | * | 10/2000 | Brown et al. | 438/294 |
| 6,362,055 | B2 | * | 3/2002 | Lin et al. | 438/275 |
| 6,376,323 | B1 | * | 4/2002 | Kim et al. | 438/373 |
| 6,399,432 | B1 | * | 6/2002 | Zheng et al. | 438/232 |
| 6,407,412 | B1 | * | 6/2002 | Iniewski et al. | 257/107 |

* cited by examiner

*Primary Examiner*—John F. Niebling
*Assistant Examiner*—Walter L. Lindsay, Jr.

(57) ABSTRACT

A method for reducing a gate length bias is disclosed. The method utilizes an additional blanket ion implantation process to adjust the etching property of the undoped conductive layer. According to the present invention, a polysilicon layer is used to form NMOS and PMOS gate electrodes so that the gate length bias between the NMOS gate electrodes and the PMOS gate electrodes can be effectively reduced.

21 Claims, 3 Drawing Sheets

METHOD FOR REDUCING GATE LENGTH BIAS

This application claim the benefit of Provisional Application No. 60/336,385, filed Oct. 31, 2001.

BACKGROUND OF THE INVENTION

1. Field of the Invention

The present invention relates to a method for reducing a gate length bias, and more particularly to a method for reducing the gate length bias resulting from a photo mask with a high transparency and different etching properties of PMOS gate electrodes and NMOS gate electrodes.

2. Description of the Related Art

Critical dimension control for modern semiconductor processes which are used to form semiconductor devices with tiny features is crucial since it will decide the reliability and electrical properties of the semiconductor devices. For example, the gate length which equals the channel length of the gate electrode of a MOSFET device is one of the most important characteristics since it would hugely affect the reliability and electrical properties of the semiconductor devices.

It is found that the etching properties of a polysilicon layer would vary after it is doped which is a tough problem for critical dimension control of the gate length of a MOSFET device. In a CMOS device, this problem becomes more serious since N type gate electrodes and P type gate electrodes coexist in one device. Accordingly, there is a gate length bias between an N type gate electrode and a P type gate electrode resulting from the different doping of the two types of gate electrodes. It is found that the etching rate of the NMOS gate electrode is faster than that of the PMOS gate electrode due to the lowering of Fermi-level resulting from the N type doping of the NMOS gate electrode. The problem set forth will be more difficult to solve as the transparency of the photo mask used to define the NMOS and PMOS gate electrodes increases or the density of gate electrode pattern decreases in turn. A photo mask with a high transparency will render the photoresist layer used to define the gate electrode pattern looser which will enlarge the gate length bias between the NMOS and PMOS gate electrodes in the etching process.

In view of the drawbacks mentioned with the prior art process, there is a continued need to develop new and improved processes that overcome the disadvantages associated with prior art processes. The advantages of this invention are that it solves the problems mentioned above.

SUMMARY OF THE INVENTION

It is therefore an object of the invention to reduce the gate length bias between the NMOS gate electrodes and the PMOS gate electrodes by using a blanket ion implantation process.

It is another object of this invention to improve the reliability and the electrical stability of a CMOS device.

In the preferred embodiment of this invention, the invention uses a method for reducing a gate length bias, the method comprising: providing a substrate having a P-well and an N-well therein and an undoped conductive layer thereon; performing an N type blanket ion implantation process on the conductive layer to form a lightly doped conductive layer; performing an N type ion implantation process on the portion of the lightly doped conductive layer over the P-well to form a heavily doped conductive layer by using an implantation mask covering the portion of the lightly doped conductive layer over the N-well, where the dosage of the blanket ion implantation process is smaller than the dosage of the ion implantation process; and defining the heavily doped conductive layer and the lightly doped conductive layer separately to form an NMOS gate electrode and a PMOS gate electrode.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1A:
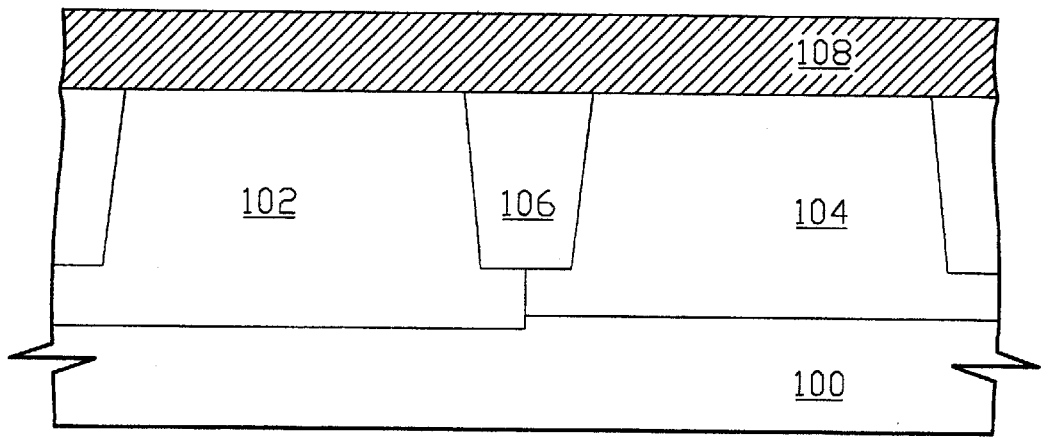
FIG. 1A shows a substrate 100 having a P-well region 102, an N-well region 104 and shallow trench isolation regions 106 therein, and an undoped polysilicon layer 108 thereon.

Referring to FIG. 1A, a substrate 100 having a P-well region 102, an N-well region 104 and shallow trench isolation regions 106 therein, an undoped conductive layer 108 comprising a polysilicon layer thereon is shown. The substrate 100 comprises, but is not limited to a P type silicon substrate with a <100> crystallographic orientation. The P-well region 102, the N-well region 104, the shallow trench isolation regions 106 and the undoped conductive layer 108 can be formed by conventional methods.

Figure 1B:
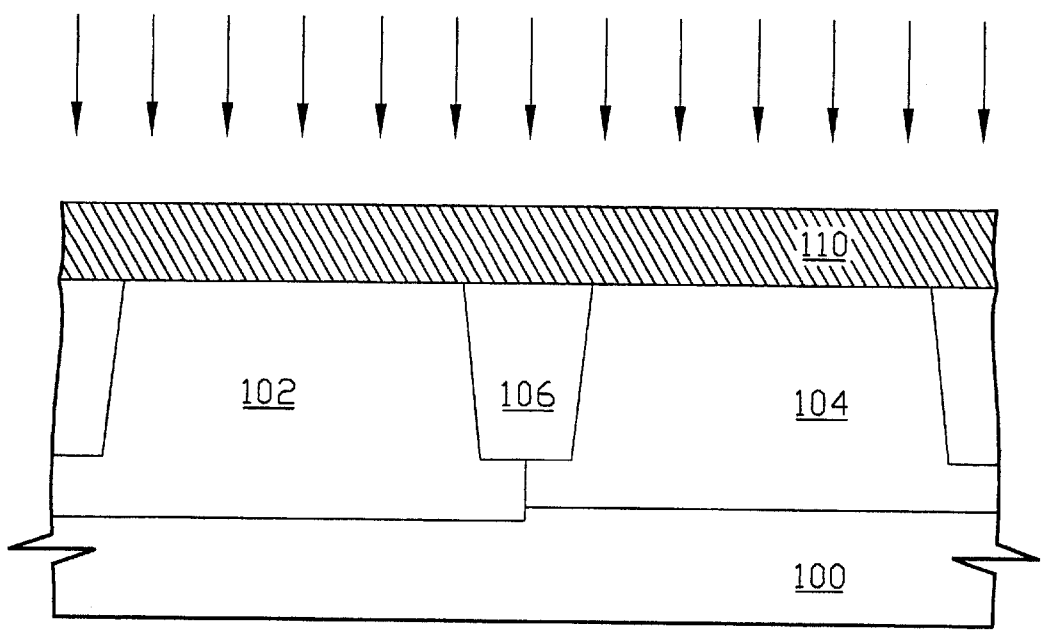
FIG. 1B shows a blanket N type ion implantation process performed on the polysilicon layer 108 to form a lightly N type doped polysilicon layer 110.

Referring to FIG. 1B, a blanket N type ion implantation process is performed on the conductive layer 108 to form a lightly N type doped conductive layer 110. The dopants comprise phosphorus ions (P+) and the dosage of this implantation process is much less than the following implantation process which is used to dope the gates of NMOS devices. For example, if the dosage of the gates of NMOS devices is about $4 \times 10^{15}$ cm$^{-2}$, the dosage of the blanket N type ion implantation process is about $10^{14}$ cm$^{-2}$. The ratio of dosage is preferably about 10:1. The implantation energy of the blanket N type ion implantation process is the same with the implantation process which is used to dope the gates of NMOS devices. The implantation energy of the blanket ion implantation process and the ion implantation process which is used to dope the gates of NMOS devices can be about 40 KeV.

Figure 1C:
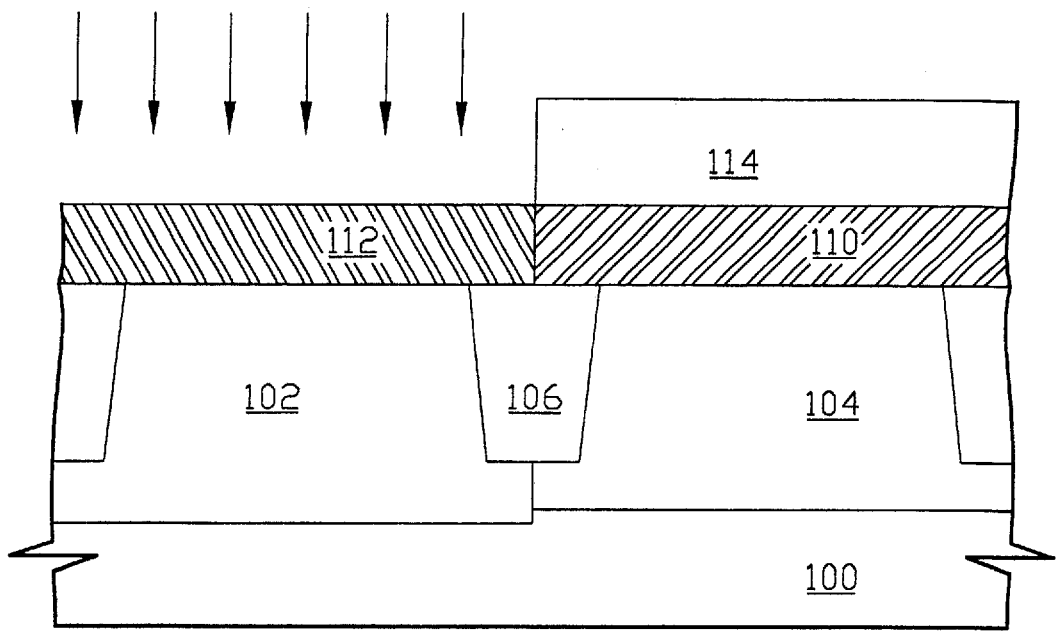
FIG. 1C shows the implantation which is used to dope the gates of NMOS devices performed on the portion of polysilicon layer 110 over the P-well region to form a heavily doped polysilicon layer 112.

Referring to FIG. 1C, the implantation process which is used to dope the gates of NMOS devices is performed on the portion of conductive layer 110 over the P-well region 102 by using a photoresist layer 114 as a mask to form a heavily doped conductive layer 112. The dosage of this implantation process plus the dosage of the blanket N type ion implantation process preferably equal to the conventional implantation process which is used to dope the gates of NMOS devices.

Figure 1D:
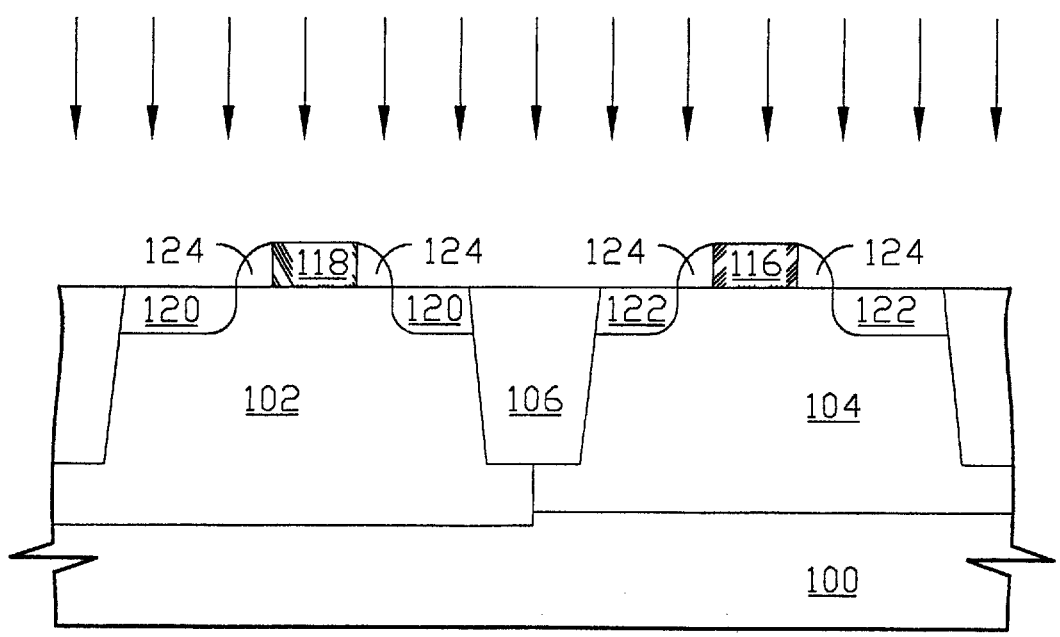
FIG. 1D shows a result of defining the heavily doped polysilicon layer 112 and the lightly N type doped polysilicon layer 110 to form an NMOS gate electrode 118 and a PMOS gate electrode 116.

Referring to FIG. 1D, the heavily doped conductive layer 112 and the lightly N type doped conductive layer 110 are defined to form an NMOS gate electrode 118 and a PMOS gate electrode 116 by conventional dry etching methods. A SiN spacer 124 is formed adjacent the NMOS gate electrode 118 and the PMOS gate electrode 116. An N type source/drain region 120 and a P type source/drain region 122 are then separately formed in P-well region 102 and N-well region 104 by conventional ion implantation processes. The dopants used to form the N type source/drain region 120 comprise arsenic ions (As+) and the dosage is in a order of $10^{15}$ cm$^{-2}$. The dopants used to form the P type source/drain region 122 comprise arsenic ions (B+) and the dosage is in a order of $10^{15}$ cm$^{-2}$. After the formation of source/drain region 120 and 122, the NMOS gate electrode 118 is N+ type and the PMOS gate electrode 116 is P+ (N) type.

Figure 2:
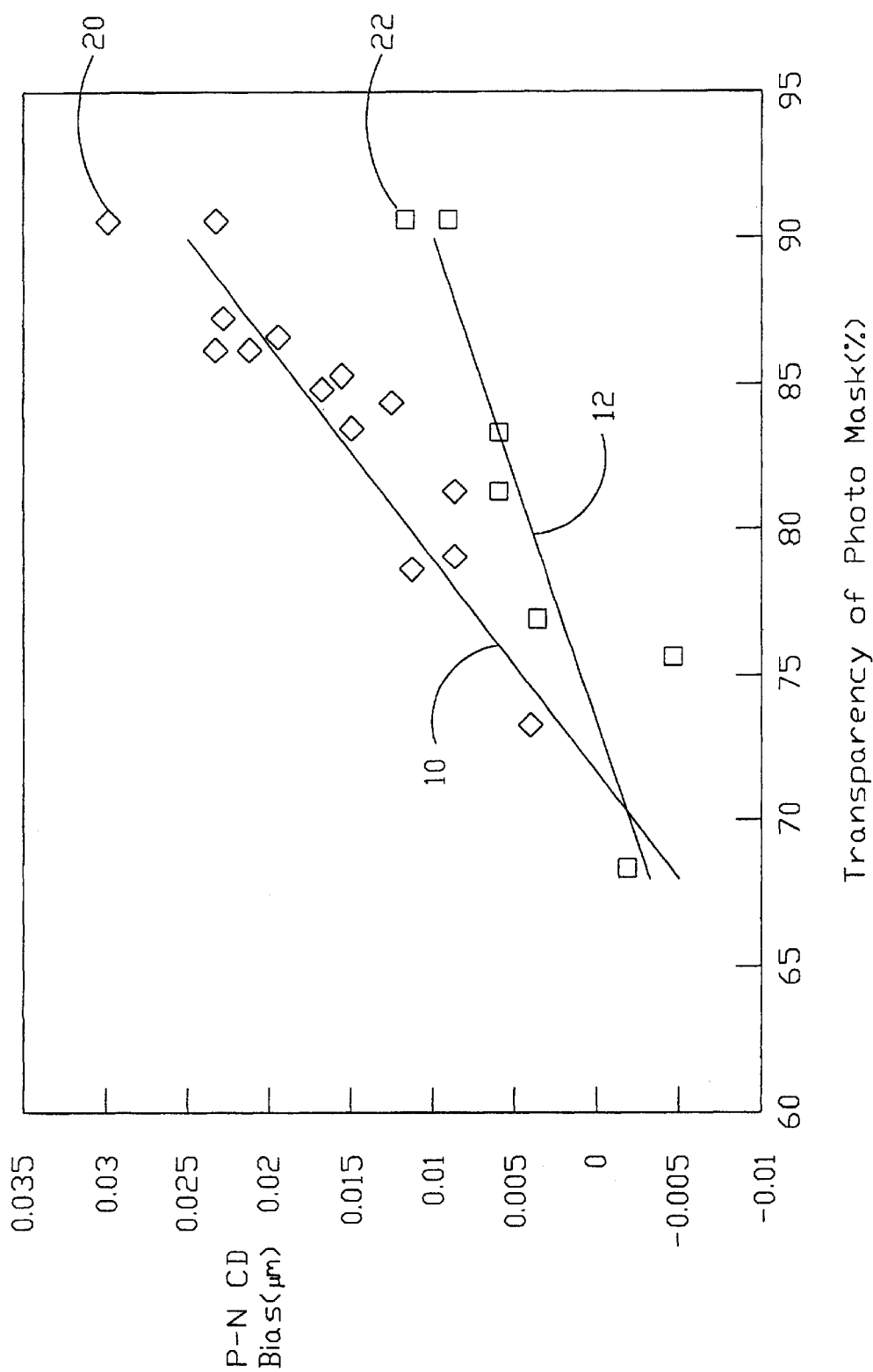
FIG. 2 shows a diagram of critical dimension bias between PMOS gate length and NMOS gate length versus the transparency of a photo mask.

Referring to FIG. 2, a diagram of critical dimension bias between PMOS gate length and NMOS gate length versus the transparency of a photo mask is shown. Line 10 represents the relation of critical dimension bias between PMOS gate length and NMOS gate length (P-N CD Bias) versus the transparency of a photo mask of conventional processes. Line 12 represents the relation of critical dimension bias between PMOS gate length and NMOS gate length versus the transparency of a photo mask of this invention. The ratio of dosage between the dosage of the gates of NMOS devices and the blanket N type ion implantation is about 10:1. As shown in FIG. 2, when the transparency of the photo mask is about 90%, the P-N CD Bias is about 0.03 micron for conventional processes as indicated via the reference character 20. The P-N CD Bias is about 0.015 micron for the process of this invention as indicated via the reference character 22. That is, referring to FIG. 1D, if the gate length of the PMOS gate electrode 116 is about 0.3 micron, the gate length of the NMOS gate electrode 118 is about 0.285 micron. For conventional processes, if the gate length of the PMOS gate electrode 116 is about 0.3 micron, the gate length of the NMOS gate electrode 118 is about 0.27 micron and such large P-N CD Bias would render the device unreliable.

The method utilizes an additional blanket ion implantation process to adjust the etching property of the undoped conductive layer such as a polysilicon layer used to form NMOS and PMOS gate electrodes so that the gate length bias between the NMOS gate electrodes and the PMOS gate electrodes can be effectively reduced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for reducing a gate length bias, said method comprising:
   providing a substrate having a P well and an N well therein and an undoped conductive layer thereon;
   performing an N type blanket ion implantation process on said conductive layer to form a lightly doped conductive layer;
   performing an N type ion implantation process on the portion of said lightly doped conductive layer over said P well to form a heavily doped conductive layer by using an implantation mask covering the portion of said lightly doped conductive layer over said N well, wherein the dosage of said blanket ion implantation process is smaller than the dosage of said ion implantation process; and
   defining said heavily doped conductive layer and said lightly doped conductive layer separately to form an NMOS gate electrode and a PMOS gate electrode.

2. The method according to claim 1, wherein said substrate comprises a P type silicon substrate.

3. The method according to claim 1, wherein said N well and said P well are isolated with a shallow trench isolation.

4. The method according to claim 1, wherein said undoped conductive layer comprises a polysilicon layer.

5. The method according to claim 1, wherein the implantation energy of said blanket ion implantation process is the same as the implantation energy of ion implantation process.

6. The method according to claim 1, wherein the dopants of said blanket ion implantation process are the same as the dopants of ion implantation process.

7. The method according to claim 6, wherein the dopants comprises phosphorus ions.

8. The method according to claim 1, wherein said implantation mask comprises a photoresist mask.

9. The method according to claim 1, wherein the dosage of said blanket ion implantation process is smaller than the dosage of said ion implantation process by about one order of magnitude.

10. A method for reducing a gate length bias, said method comprising:
    providing a substrate having a P well and an N well therein and an undoped polysilicon layer thereon;
    performing an N type blanket ion implantation process on said polysilicon layer to form a lightly doped polysilicon layer;
    performing an N type ion implantation process on the portion of said lightly doped polysilicon layer over said P well to form a heavily doped polysilicon layer by using an implantation mask covering the portion of said lightly doped polysilicon layer over said N well, wherein the dosage of said blanket ion implantation process is smaller than the dosage of said ion implantation process by about one order of magnitude;
    and defining said heavily doped polysilicon layer and said lightly doped polysilicon layer separately to form an NMOS gate electrode and a PMOS gate electrode.

11. The method according to claim 10, wherein said substrate comprises a P type silicon substrate.

12. The method according to claim 10, wherein said N well and said P well are isolated with a shallow trench isolation.

13. The method according to claim 10, wherein the implantation energy of said blanket ion implantation process is the same as the implantation energy of ion implantation process.

14. The method according to claim 13, wherein the implantation energy of said blanket ion implantation process and said ion implantation process is about 40 KeV.

15. The method according to claim 10, wherein the dopants of said blanket ion implantation process are the same as the dopants of ion implantation process.

16. The method according to claim 15, wherein the dopants comprises phosphorus ions.

17. The method according to claim 10, wherein said implantation mask comprises a photoresist mask.

18. A method for reducing a gate length bias, said method comprising:

providing a P type silicon substrate having a P well and an N well therein and an undoped polysilicon layer thereon;

performing an N type blanket ion implantation process with dopants of phosphorus ions on said polysilicon layer to form a lightly doped polysilicon layer;

performing an N type ion implantation process with dopants of phosphorus ions on the portion of said lightly doped polysilicon layer over said P well to form a heavily doped polysilicon layer by using an implantation mask covering the portion of said lightly doped polysilicon layer over said N well, wherein the dosage of said blanket ion implantation process is smaller than the dosage of said ion implantation process by about one order of magnitude; and defining said heavily doped polysilicon layer and said lightly doped polysilicon layer separately to form an NMOS gate electrode and a PMOS gate electrode.

19. The method according to claim 18, wherein said N well and said P well are isolated with a shallow trench isolation.

20. The method according to claim 18, wherein the implantation energy of said blanket ion implantation process is the same as the implantation energy of ion implantation process.

21. The method according to claim 20, wherein the implantation energy of said blanket ion implantation process and said ion implantation process is about 40 KeV.

* * * * *